United States Patent
Maki et al.

(10) Patent No.: US 8,895,997 B2
(45) Date of Patent: Nov. 25, 2014

(54) CARBON NANOTUBE LIGHT EMITTING DEVICE, LIGHT SOURCE, AND PHOTO COUPLER

(75) Inventors: Hideyuki Maki, Yokohama (JP); Youhei Yamauchi, Yokohama (JP)

(73) Assignee: Keio University, Tokyo (JP)

( * ) Notice: Subject to any disclaimer, the term of this patent is extended or adjusted under 35 U.S.C. 154(b) by 165 days.

(21) Appl. No.: 13/643,857

(22) PCT Filed: Apr. 1, 2011

(86) PCT No.: PCT/JP2011/058406
§ 371 (c)(1),
(2), (4) Date: Dec. 19, 2012

(87) PCT Pub. No.: WO2011/135978
PCT Pub. Date: Nov. 3, 2011

(65) Prior Publication Data
US 2013/0087758 A1 Apr. 11, 2013

(30) Foreign Application Priority Data
Apr. 28, 2010 (JP) .................. 2010-104124

(51) Int. Cl.
| | |
|---|---|
| H01L 27/15 | (2006.01) |
| H01L 29/26 | (2006.01) |
| H01L 31/12 | (2006.01) |
| H01L 33/00 | (2010.01) |
| H01K 1/06 | (2006.01) |
| H01L 33/04 | (2010.01) |
| H04B 10/80 | (2013.01) |
| B82Y 20/00 | (2011.01) |
| H01L 51/00 | (2006.01) |
| H01K 1/10 | (2006.01) |
| H01K 3/02 | (2006.01) |
| B82Y 10/00 | (2011.01) |
| B82Y 30/00 | (2011.01) |
| H01L 51/50 | (2006.01) |
| H01L 51/52 | (2006.01) |

(52) U.S. Cl.
CPC ........ *H01L 33/04* (2013.01); *H01K 1/06* (2013.01); *B82Y 10/00* (2013.01); *B82Y 30/00* (2013.01); *H04B 10/80* (2013.01); *H01L 51/5012* (2013.01); *B82Y 20/00* (2013.01); *Y10S 977/95* (2013.01); *H01L 51/0048* (2013.01); *H01K 1/10* (2013.01); *H01L 51/5296* (2013.01); *H01K 3/02* (2013.01)
USPC .......................................... 257/79; 977/950

(58) Field of Classification Search
None
See application file for complete search history.

(56) References Cited

U.S. PATENT DOCUMENTS 6,528,020 B1 * 3/2003 Dai et al. ............... 422/98
6,750,463 B1   6/2004 Riley
(Continued)

FOREIGN PATENT DOCUMENTS

| JP | A-2003-534645 | 11/2003 |
| JP | A-2008-523254 | 7/2008 |

(Continued)

OTHER PUBLICATIONS

International Preliminary Report on Patentability issued in International Patent Application No. PCT/JP2011/058406 dated Aug. 23, 2012 (with translation).

(Continued)

*Primary Examiner* — Andres Munoz
(74) *Attorney, Agent, or Firm* — Oliff PLC

(57) ABSTRACT

A plurality of electrodes, and carbon nanotubes disposed between the electrodes, at least part of the carbon nanotubes including a metal carbon nanotube are provided. The metal carbon nanotube generates heat upon passing of current to the electrodes and emits light by blackbody radiation, so that the emitted light has a wide emission wavelength region and can be modulated at high speed. This makes it possible to implement a continuum spectrum light source that can be modulated at high speed, which is suitable for use in information communication, electrical and electronic fields.

14 Claims, 9 Drawing Sheets

(56) References Cited

U.S. PATENT DOCUMENTS

| | | |
|---|---|---|
| 8,471,238 B2 * | 6/2013 | Ward et al. .............. 257/13 |
| 2004/0023514 A1 * | 2/2004 | Moriya et al. ............ 438/778 |
| 2008/0170982 A1 | 7/2008 | Zhang et al. |
| 2009/0096348 A1 | 4/2009 | Liu et al. |
| 2009/0202422 A1 | 8/2009 | Kajiura et al. |
| 2010/0245215 A1 | 9/2010 | Liu et al. |
| 2010/0278714 A1 | 11/2010 | Tanaka et al. |
| 2011/0297846 A1 * | 12/2011 | Wang ................... 250/459.1 |

FOREIGN PATENT DOCUMENTS

| | | |
|---|---|---|
| JP | A-2009-94074 | 4/2009 |
| JP | A-2009-132604 | 6/2009 |
| JP | A-2009-161393 | 7/2009 |
| JP | A-2009-283303 | 12/2009 |
| JP | A-2010-231210 | 10/2010 |
| WO | WO 2008/139763 A1 | 11/2008 |
| WO | WO 2009/075293 A1 | 6/2009 |

OTHER PUBLICATIONS

Misewich, J.A. et al., "Electrically Induced Optical Emission from a Carbon Nanotube FET," Science, 2003, vol. 300, pp. 783-786.

Freitag, Marcus et al., "Mobile Ambipolar Domain in Carbon-Nanotube Infrared Emitters," Physical Review Letters, 2004, vol. 93, No. 7, pp. 076803-1 through 076803-4.

Freitag, Marcus et al., "Hot Carrier Electroluminescence from a Single Carbon Nanotube," Nano Letters, 2004, vol. 4, No. 6, pp. 1063-1066.

Chen, Jia et al., "Bright Infrared Emission from Electrically Induced Excitons in Carbon Nanotubes," Science, 2005, vol. 310, pp. 1171-1174.

Freitag, Marcus et al., "Electrically Excited, Localized infrared Emission from Single Carbon Nanotubes," Nano Letters, 2006, vol. 6, No. 7, pp. 1425-1433.

Mann, David et al., "Electrically Driven Thermal Light Emission from Individual Single-Walled Carbon Nanotubes," Nature Nanotechnology, 2007, vol. 2, pp. 33-38.

Marty, L. et al., "Exciton Formation and Annihilation during 1D Impact Excitation of Carbon Nanotubes," Physical Review Letters, 2006, vol. 96, pp. 136803-1 through 136803-4.

Adam, E. et al., "Electroluminescence from Single-Wall Carbon Nanotube Network Transistors," Nano Letters, 2008, pp. A-E.

Wei, Jinquan et al., "Carbon Nanotube Filaments in Household Light Bulbs," Applied Physics Letters, 2004, vol. 84, No. 24, pp. 4869-4871.

Li, Peng et al., "Polarized Incandescent Light Emission from Carbon Nanotubes," Applied Physics Letters, 2003, vol. 82, No. 11, pp. 1763-1765.

Fan, Yuwei et al., "Probing Planck's Law with Incandescent Light Emission from a Single Carbon Nanotube," Physical Review Letters, vol. 102, pp. 187402-1 through 187402-4, Year: 2009.

International Search Report issued in International Patent Application No. PCT/JP2011/058406 mailed May 10, 2011.

* cited by examiner (A)

(B)

(A)

(B)

(A)

(B)

(A)

(B)

CARBON NANOTUBE LIGHT EMITTING DEVICE, LIGHT SOURCE, AND PHOTO COUPLER

TECHNICAL FIELD

The present invention relates to carbon nanotube light emitting devices, light sources and photo couplers, and more particularly relates to a carbon nanotube light emitting device capable of implementing a continuum spectrum light source that can be modulated at high speed, and a light source and a photo coupler using the carbon nanotube light emitting device, which are suitable for use in information communication, electrical and electronic fields.

BACKGROUND ART

Research on carbon nanotubes (CNTs) is vigorously being conducted ever since light emission by the carbon nanotubes was observed by photoluminescence measurement involving light excitation to observe light emission. In recent years, light emission by the carbon nanotubes due to current injection was observed, and as a consequence, carbon nanotubes have also come to be expected as light emitting devices. Light emitting devices using carbon nanotubes have been reported in Non-Patent Literatures 1 to 8. However, research and development on high-speed modulation performance of the carbon nanotube light emitting devices had not been reported at all and the field thereof had not yet been explored.

A light emission mechanism of the carbon nanotube light emitting devices is divided into two categories: (a) light emission by electron-hole recombination; and (b) light emission by blackbody radiation.

(a) Light Emission by Electron-Hole Recombination

Today, vigorous research is mainly conducted with respect to the light emission mechanism by electron-hole recombination. The light emission by electron-hole recombination is implemented in such a manner that an electron and a hole are excited in a semiconductor carbon nanotube by a certain method and the excited electron and hole are recombined to thereby emit light. This is the light emission principle that applies to light emitting diodes (LEDs) in solid-state semiconductors today.

Reported as the excitation method are (i) electron/hole injection excitation, (ii) impact excitation, and (iii) thermal excitation. Method (i) is to inject an electron and a hole from opposite two electrodes formed on a carbon nanotube and to emit light by recombination of the injected electron and hole. Method (ii) is to inject a hole (or an electron) having high kinetic energy from an electrode, use energy, which is produced when the kinetic energy is lost, to generate an electron-hole pair (exciton), and to emit light by relaxation of the exciton. Method (iii) is to excite an electron by thermal energy created by heating, such as Joule heat when current passes through a carbon nanotube, and to emit light by relaxation of the electron with a hole.

(b) Light Emission by Blackbody Radiation

All substances radiate electromagnetic waves with heat at temperatures over an absolute zero-point (blackbody radiation). An emission spectrum in the blackbody radiation is described based on Planck's law, and energy of the thermal radiation conforms to Stefan-Boltzmann law stating that the energy of thermal radiation is proportional to the fourth power of temperature T. Today, the blackbody radiation is used in, for example, tungsten filaments for electric bulbs, which are for use in lighting and the like.

Carbon nanotubes have also been reported to be bundled into the form of filaments so that heating the carbon nanotubes by passing of current makes them emit light like filaments (Non-Patent Literature 9). However, in the case of light emission in the form of filaments, on-off modulation cannot be performed at high speed just as in the case of tungsten electric bulbs. There are also reports that blackbody radiation was observed by passing current to multi-walled carbon nanotubes in the form of a thick bundle of about several μm (Non-Patent Literature 10) and to a thick multi-walled carbon nanotube of about 13 nm in diameter which is disposed on a substrate (Non-Patent Literature 11). These reports indicate that the blackbody radiation conforms to Planck's law. However, high speed modulation is difficult in thick carbon nanotubes, and therefore high speed modulation is not yet attempted therein.

Unlike in the case of light emitting diodes and laser diodes, blackbody radiation has a characteristic that a continuum spectrum (continuum spectrum light source) in a wide wavelength range can be obtained. However, in the blackbody radiation by conventional filaments and the like, high-speed modulation performance is not attained. In the present circumstances, therefore, there is no continuum spectrum light source that can be modulated at high speed.

The light emitting devices reported so far are roughly categorized into two types: light emitting devices using one carbon nanotube; and light emitting devices formed with a carbon nanotube thin film (carbon nanotube network) including a large number of carbon nanotubes.

The light emitting devices using one carbon nanotube have been reported in Non-Patent Literatures 1 to 6, while in Non-Patent Literatures 7 and 8, light emission is observed by using a bundle of carbon nanotubes which are referred to as bundled carbon nanotubes formed by tangling several carbon nanotubes into one bundle. The light emitting device using one carbon nanotube or one bundle of carbon nanotubes has characteristics that single light emitted thereby is easily taken out and that its spectrum width is narrow. However, it is necessary (1) to observe a substrate with the carbon nanotube grown thereon under a microscope to find out the one carbon nanotube, or (2) to select, out of a large number of devices which were fabricated, one device accidentally formed as a single electrode. Accordingly, yields of devices are generally poor.

Contrary to the above, the light emitting device using a carbon nanotube thin film (or network), which has been proposed by the applicant in Patent Literature 1, can be fabricated with sufficient yields. However, the light emitting device formed with a carbon nanotube thin film has a characteristic that an emission spectrum thereof becomes broader than the light emitting device formed with one carbon nanotube. In Non-Patent Literatures 7 and 8, light emission from thin-film carbon nanotube devices was also reported.

CITATION LIST

Patent Literature

Patent Literature 1: Japanese Patent Application Laid-Open No. 2009-283303

Non-Patent Literature

Non-Patent Literature 1: J. A. Misewich et al., Science 300, 783 (2003)
Non-Patent Literature 2: Freitag, M.; Chen, J.; Tersoff, J.; Tsang, J. C.; Fu, Q.; Liu, J.; Avouris, Ph. Phys. ReV. Lett. 2004, 93, 076803.

Non-Patent Literature 3: Freitag, M.; Perebeinos, V.; Chen, J.; Stein, A.; Tsang, J. C.; Misewich, J. A.; Martel, R.; Avouris, Ph. Nano Lett. 2004, 4, 1063.

Non-Patent Literature 4: Chen, J.; Perebeinos, V.; Freitag, M.; Tsang, J. C.; Fu, Q.; Liu, J.; Avouris, Ph. Science 2005, 310, 1171.

Non-Patent Literature 5: Marcus Freitag, James C. Tsang, John Kirtley, Autumn Carlsen, Jia Chen, Aico Troeman, Hans Hilgenkamp, and Phaedon Avouris, Nano Letters 6, 1425 (2006)

Non-Patent Literature 6: DAVID MANN, Y. K. KATO, ANIKA KINKHABWALA, ERIC POP, JIEN CAO, XIN-RAN WANG, LI ZHANG, QIAN WANG, JING GUO AND HONGJIE DAI, Nature nanotechnology, 2, 33 (2007).

Non-Patent Literature 7: L. Marty, E. Adam, L. Albert, R. Doyon, D. Ménard, and R. Martel, Phys. Rev. Lett. 96, 136803 (2006)

Non-Patent Literature 8: E. Adam, C. M. Aguirre, L. Marty, B. C. St-Antoine, F. Meunier, P. Desjardins, D. Ménard, and R. Martel, Nano Letters, 8, 2351 (2008)

Non-Patent Literature 9: Jinquan Wei, Hongwei Zhu, Dehai Wu, Bingqing Wei, APPLIED PHYSICS LETTERS 84, 4869 (2004)

Non-Patent Literature 10: Peng Li, Kaili Jiang, Ming Liu, Qunqing Li, and Shoushan Fan, Jialin Sun, APPLIED PHYSICS LETTERS 82, 1763 (2003)

Non-Patent Literature 11: Yuwei Fan, S. B. Singer, Raymond Bergstrom, and B. C. Regan, PHYSICAL REVIEW LETTERS 102, 187402 (2009)

SUMMARY OF INVENTION

Problem to be Solved by the Invention

The carbon nanotube light emitting devices reported so far are light emitting devices driven by direct voltage or direct current and without modulation. When light emitting devices are used in optical communication and optical integrated circuits, on/off control through high speed modulation is necessary. Accordingly, it is impossible to use conventional carbon nanotube light emitting devices for optical information communication. In order to transmit a large amount of information by optical communication, light emitting devices that can be modulated at high speed are required.

Moreover, in the light emitting diodes and laser diodes which are currently used for high speed modulation, light emission relating to relaxation between specific energies is used. As a result, a continuum spectrum (continuum spectrum light source) in a wide wavelength range cannot be attained thereby. In this regard, continuum spectrum light sources by conventional filaments do not have high-speed modulation performance. In the present circumstances, therefore, there is no continuum spectrum light source that can be modulated at high speed.

The present invention has been made in order to solve the above-mentioned conventional problems, and it is an object of the present invention to implement a continuum spectrum light source that can be modulated at high speed.

Solution to Problem

The carbon nanotubes (CNTs) include, depending on the configuration (chirality) thereof, semiconductor carbon nanotubes with a band gap and metal carbon nanotubes without a band gap. In the case of using semiconductor carbon nanotubes out of these two types of carbon nanotubes, a Schottky barrier is generated due to metal-semiconductor junction in the vicinity of a junction portion with electrode metal. Since the Schottky barrier hinders carrier injection from the electrodes to the carbon nanotubes, the voltage needed for achieving blackbody radiation increases in the semiconductor carbon nanotubes. In the metal carbon nanotubes, the Schottky barrier is not generated, so that carrier injection is efficiently performed. In case where one metal carbon nanotube is compared with a semiconductor carbon nanotube, as shown in FIG. 1, when a 1V voltage is applied, a current of about 10 µA passes through the metal carbon nanotube (see FIG. 1(a)), whereas a current of only a few dozen nA passes through the semiconductor carbon nanotube (see FIG. 1(b)). Therefore, the metal carbon nanotube can implement blackbody radiation at a voltage considerably lower than that in the case of the semiconductor carbon nanotube.

Generally, when carbon nanotubes are created, metal carbon nanotubes and semiconductor carbon nanotubes are mixedly created. When a plurality of carbon nanotubes are used and at least one metal carbon nanotube exists therein, light is emitted from the metal carbon nanotube. Recently, a technology for separating metal carbon nanotubes and semiconductor carbon nanotubes by electrophoresis and/or centrifugal separation has been developed as a technology for separating metal carbon nanotubes. This makes it possible to create light emitting devices using only metal carbon nanotubes.

The present invention has been made on the basis of such knowledge, and includes: a plurality of electrodes; and carbon nanotubes disposed between the electrodes, at least part of the carbon nanotubes including a metal carbon nanotube, wherein the metal carbon nanotube generates heat upon passing of current to the electrodes and emits light by blackbody radiation, so that the emitted light has a wide emission wavelength region and can be modulated at high speed. This can solve the aforementioned problems.

The metal carbon nanotube and the electrodes may be disposed on a substrate, so that heat dissipation performance may be enhanced.

Moreover, at least a surface of the metal carbon nanotube may be covered with an insulator.

The present invention also provides a light source including the above-described carbon nanotube light emitting device.

The metal carbon nanotube may be disposed on a transparent substrate so as to be orthogonal to an optical fiber.

The metal carbon nanotube and the electrodes may be disposed on the substrate so that light may be emitted in a direction parallel to a surface of the substrate.

Alternatively, the metal carbon nanotube and the electrodes may be disposed on the substrate so that light may be emitted in a direction perpendicular to the surface of the substrate.

The present invention also provides a photo coupler including: the carbon nanotube light emitting device described above; and a light receiving device.

Advantageous Effects of Invention

According to the present invention, the light emitting device that can be modulated at high speed can be obtained simply by forming electrodes on a metal carbon nanotube. In the case where the obtained light emitting device is applied to optical communication, the modulation performance thereof can be expected to provide ultra high-speed communication of at least about 1 to 3 Gbps. The light emitting device can be easily fabricated on various substrates such as Si substrates by integration. Accordingly, the light emitting device is applicable to a broad range of electronic and information communication fields such as optical communication using optical fibers and optical integrated circuits made by fabrication of light emitting devices on the integrated circuits.

Moreover, the present invention has a characteristic that a continuum spectrum (continuum spectrum light source) in a wide wavelength range can be obtained, which is impossible in conventional light emitting diodes and laser diodes. In the blackbody radiation by conventional filaments and the like, high-speed modulation performance is not attained, and in the present circumstances, there is no continuum spectrum light source that can be modulated at high speed. However, according to the present invention, a continuum spectrum light source that can be modulated at high speed can be implemented.

The present invention has characteristics that (a) the light emitting device that can be modulated at very high speed can easily be integrated on silicon unlike compound semiconductors, and (b) the light emitting device that can be modulated at very high speed can be fabricated at a low cost since expensive semiconductor fabrication apparatuses for use in compound semiconductors and the like are not necessary. Accordingly, the present invention is applicable not only to optical fiber communication but also to various applications which require high-speed modulation performance such as optical integrated circuits on silicon substrates, short-distance information transmission between chips and between boards, and photo couplers.

BRIEF DESCRIPTION OF DRAWINGS

FIG. 4(A) is a diagram showing a result of time-resolved emission measurement calculated from applied voltage also upon application of pulse voltage, while FIG. 4(B) is a diagram showing a result of observed fitting between the time-resolved emission measurement result and rise and fall times;

DESCRIPTION OF EMBODIMENTS

Hereinbelow, embodiments of the present invention will be described with reference to the accompanying drawings.

Figure 1:
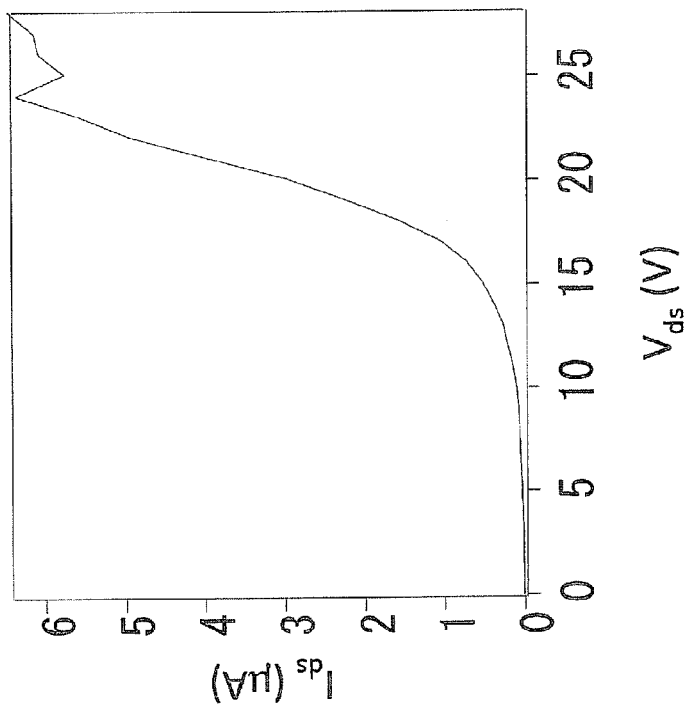
FIG. 1 is a diagram showing current voltage characteristics of carbon nanotubes.
Figure 1:
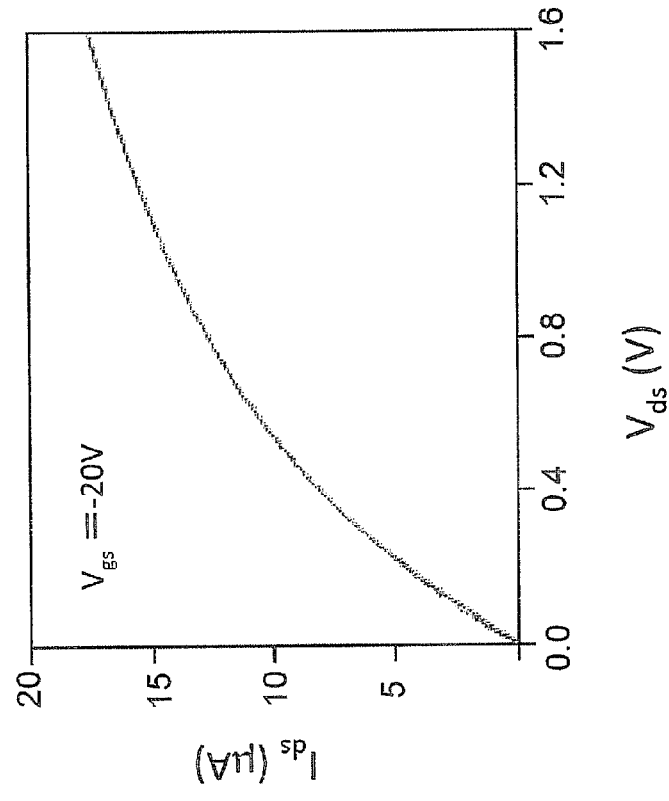
Figure 2:
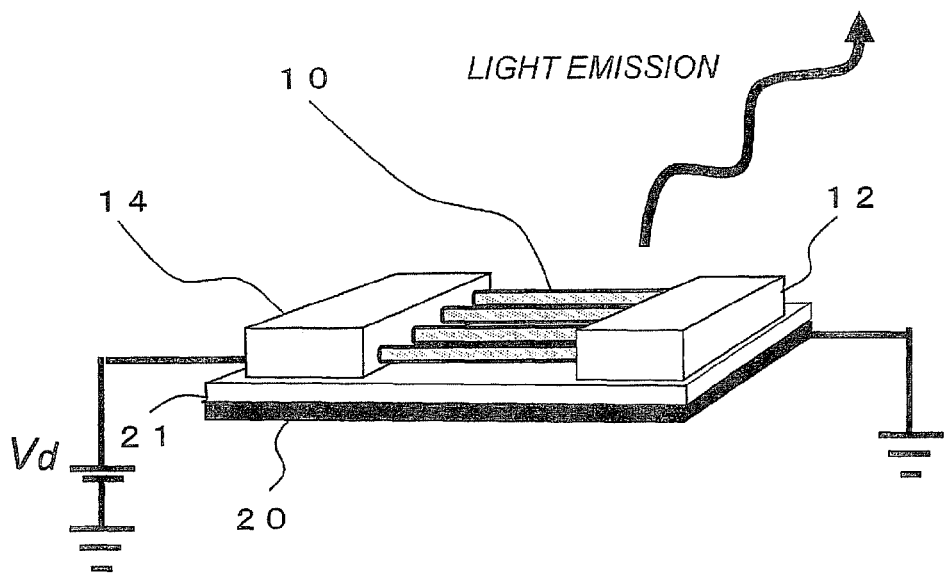
FIG. 2 is a perspective view showing the configuration of a light emitting device which is a first embodiment of the present invention.

A light emitting device which is a first embodiment of the present invention has an device configuration in which a source electrode 12 and a drain electrode 14 are formed for carbon nanotube thin films including one (one bundle of) metal carbon nanotube(s) or a plurality of metal carbon nanotubes (CNTs) 10 as shown in FIG. 2.

As a substrate 20, any kinds of substrates, such as Si, $SiO_2$, $Al_2O_3$ and MgO substrates, may be used as long as a source-drain line is not electrically short-circuited. In the drawing, reference numeral 21 denotes a $SiO_2$ film provided on the substrate 20.

The electrodes 12 and 14 may take any shape such as a rectangular shape. They may be formed into comb shaped electrodes to provide a larger emission area. The electrodes may be made of any materials such as metal and semiconductors as long as current can pass therethrough.

As shown in FIG. 2, the carbon nanotube 10 is disposed between the source electrode and the drain electrode. The carbon nanotubes disposed between the electrodes may be one carbon nanotube/one bundle of carbon nanotubes or may be a plurality of carbon nanotubes. In the case of a plurality of the carbon nanotubes, yields and luminous intensity are improved. The carbon nanotubes for use may be made by any kinds of growth methods, such as chemical vapor deposition, arc discharge, laser ablation, and HiPco methods. When a plurality of the carbon nanotubes are used, semiconductor carbon nanotubes and metal carbon nanotubes may be present mixedly therein since light can be emitted from the metal carbon nanotubes if one or more metal carbon nanotubes are included in the plurality of carbon nanotubes. Metal carbon nanotubes separated from other carbon nanotubes by electrophoresis and/or centrifugal separation may also be used.

The carbon nanotubes 10 for use in the light emitting device of the first embodiment may be laid against the substrate 20 so as to be in contact therewith, or may be bridged so that only both the ends of the carbon nanotubes are supported onto the substrate. The carbon nanotubes may be exposed into the atmosphere and may be covered with insulation materials such as $SiO_2$, glass, and sapphire. However, since carbon nanotubes are damaged through reaction with oxygen in the atmosphere, it is preferable that the carbon nanotubes be covered with insulation materials or held in the vacuum so that the carbon nanotubes can be prevented from being damaged by the reaction with oxygen.

Figure 3:
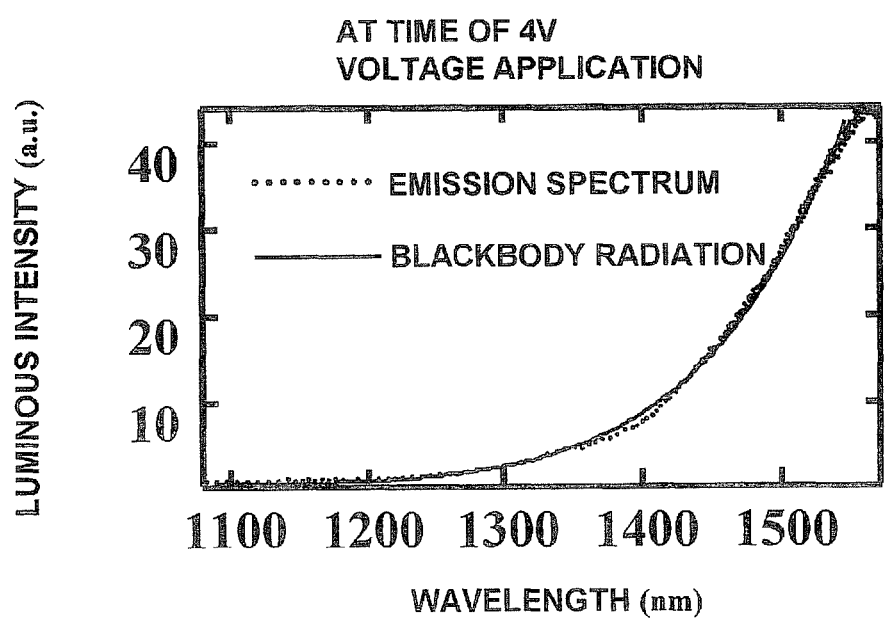
FIG. 3 is an emission spectrum diagram upon application of voltage to the first embodiment.
Figure 4:
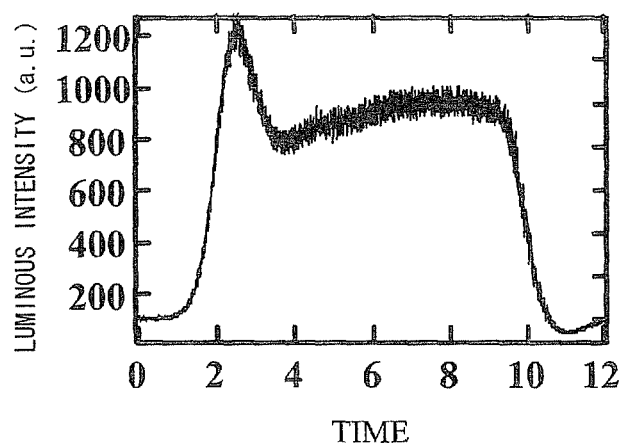
Figure 4:
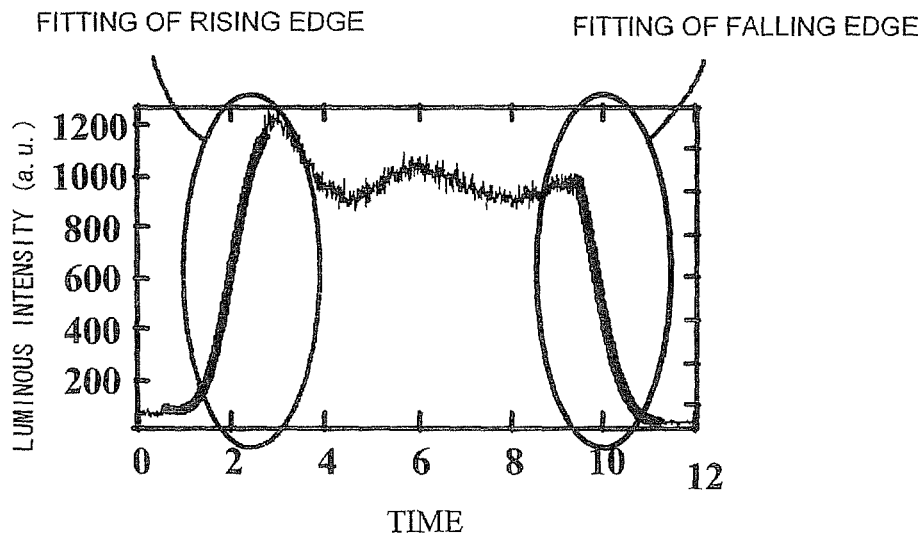
Figure 5:
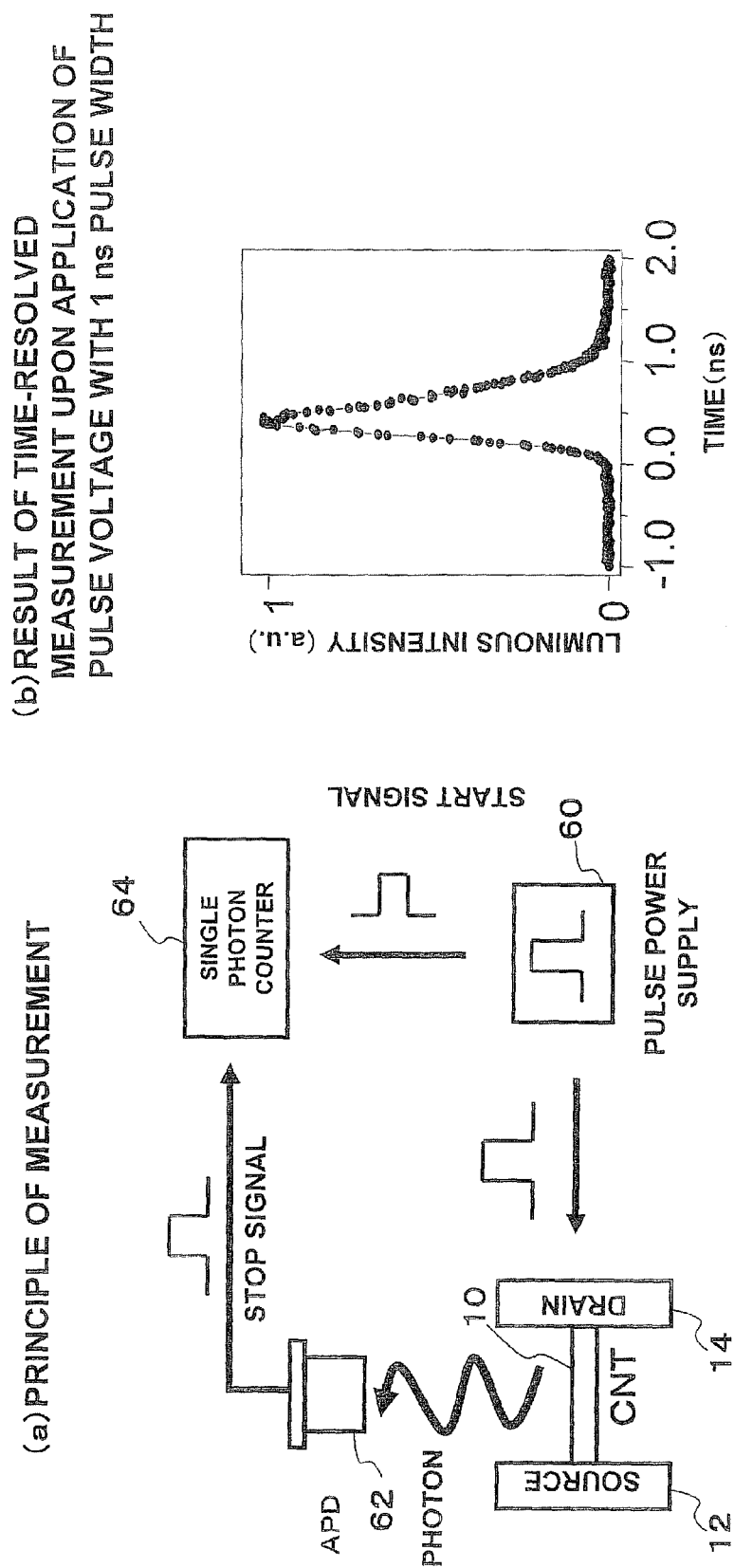
FIG. 5 is a diagram showing a result of time-resolved emission measurement also upon application of a 1 ns pulse.

FIG. 3 shows an example of an emission spectrum at the time of applying voltage (4V) to the light emitting device of the first embodiment. The light emitting device is one example of a light emitting device using a large number of carbon nanotubes 10 which are laid against the substrate 20 so as to be in contact therewith. Moderate light emission observed on the long wavelength side is attributed to blackbody radiation caused by the heat generated by the carbon nanotubes 10 due to passing of current. FIG. 4 shows an observation result of time-resolved measurement of light emission at the time of applying pulse voltage in connection with the light emission on the long wavelength side. FIG. 4 also shows time dependency of the luminous intensity estimated on the basis of the applied pulse voltage (4V). Based on both the results, a light emission pulse in accordance with the applied pulse voltage is observed. Rise time and fall time of the emitted light in the time-resolved measurement were calculated by fitting. As a result, a 1 ns rise time and a 0.1 ns fall time were estimated and thereby it was confirmed that the light emitted could be modulated at high speed by pulse voltage. The result indicates that the emitted light can be modulated at high speed by application of the voltage modulated at high speed and that high-speed optical communication of about 1 Gbps or more can be achieved according to the rise time and fall time. Moreover, by utilizing the fact that a time-based intensity distribution of all the photons generated by one excitation matches with a time-based generation probability of one first device generated by one excitation, a measuring apparatus configured as shown in FIG. 5($a$) was used to apply a pulse voltage (4V) of 1 ns to the metal CNT 10 from a pulse power supply 60, to detect light emitted upon application of the pulse voltage by an APD 62, and to perform time-resolved measurement on the detected light by a single photon counter 64. The result of the measurement is shown in FIG. 5($b$). It was confirmed that the response speed of light emission by blackbody radiation from CNTs is about at least 1 GHz. The time-resolved measurement of the light emitted from the carbon nanotubes is performed through an optical fiber, which indicates that the light emitting device can be used in high-speed optical communication using an optical fiber.

The high speed modulation of the light emitted by blackbody radiation is implemented due to (1) the carbon nanotubes having considerably small heat capacity attributed to the carbon nanotubes being minute one-dimensional materials with a diameter of about 1 nm, and (2) the carbon nanotubes having extremely high thermal conductivity. Because of these, the heat generated when current is passed through the carbon nanotubes implements swift temperature rise and temperature fall. Therefore, light can be modulated at high speed even though the light is emitted by blackbody radiation. Such high speed modulation of the light emitted by blackbody radiation can be attained by both the light emitting devices with one/one bundle of carbon nanotubes and the light emitting devices using a large number of carbon nanotubes. Moreover, high speed modulation is possible regardless of whether the light emitting device is a carbon nanotube light emitting device laid on the substrate or a bridged carbon nanotube light emitting device.

It is to be noted that in the high speed modulation according to the principle of light emission by blackbody radiation, the high speed modulation can be attained by rapid change in temperature of the carbon nanotubes with small thermal energy. Accordingly, when the nanotubes to be used are in contact with a substrate which can provide high heat dissipation performance or are covered with a material which can provide high heat dissipation performance, improvement of the fall time can be exhibited.

Moreover, the carbon nanotubes for use in blackbody radiation can be fabricated with any kinds of carbon nanotubes such as single-layered carbon nanotubes, double-layered carbon nanotubes, and multi-walled carbon nanotubes. It is to be noted that the single-layered carbon nanotubes are smaller in heat capacity than the multi-walled carbon nanotubes so that the single-layered carbon nanotubes has an enhanced high speed modulation characteristic. In the case where a carbon nanotube thin film including a large number of carbon nanotubes is used, high speed modulation performance is enhanced by smaller heat capacity and swift heat dissipation to the substrate. Accordingly, the enhanced modulation performance is achieved not by using a carbon nanotube thin film formed with a thick bundle of a large number of carbon nanotubes but by using a carbon nanotube thin film made of carbon nanotubes which are isolated from each other.

Figure 6:
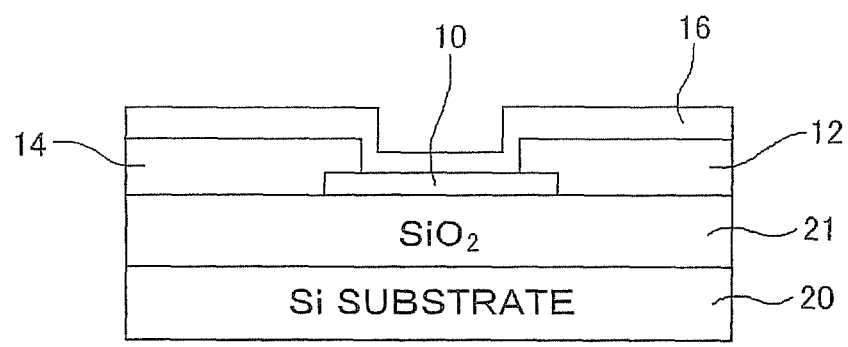
FIG. 6 is a cross sectional view showing the configuration of a light emitting device which is a second embodiment of the present invention.

In order to achieve long-time blackbody radiation, it is preferable to provide an insulating film 16, as seen in a light emitting device which is a second embodiment of the present invention shown in FIG. 6, to prevent reaction with oxygen in the atmosphere. The insulating film 16 may be made of any materials such as oxide insulators including $SiO_2$, SiN, SiON, $Al_2O_3$, MgO, $HfO_2$, etc., and polymeric-material insulators including PMMA as long as the materials have insulation properties and can transmit light.

A description will now be given of a continuum spectrum light source which is a third embodiment of the present invention adequately used as a light source incident to optical fibers.

Figure 7:
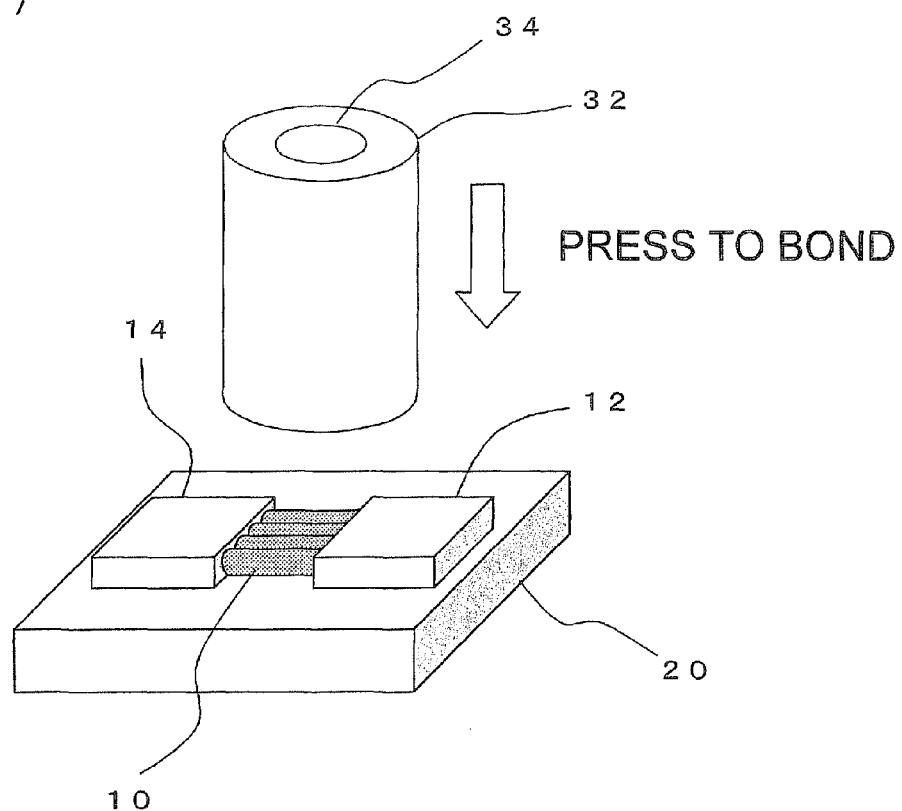
FIG. 7 is an exploded perspective view showing a third embodiment of the present invention which is a continuum spectrum light source using the light emitting device according to the present invention.

As shown in FIG. 7, the present embodiment is configured such that a core 34 of an optical fiber 32 is pressed against a light emitting device similar to the first embodiment and is bonded thereto with adhesives such as PMMA and epoxy.

According to the present embodiment, light can efficiently be made to come incident into the core 34 of the optical fiber 32.

A description will now be given of a continuum spectrum light source in a fourth embodiment of the present invention in which light is emitted in a direction parallel to a substrate.

Figure 8:
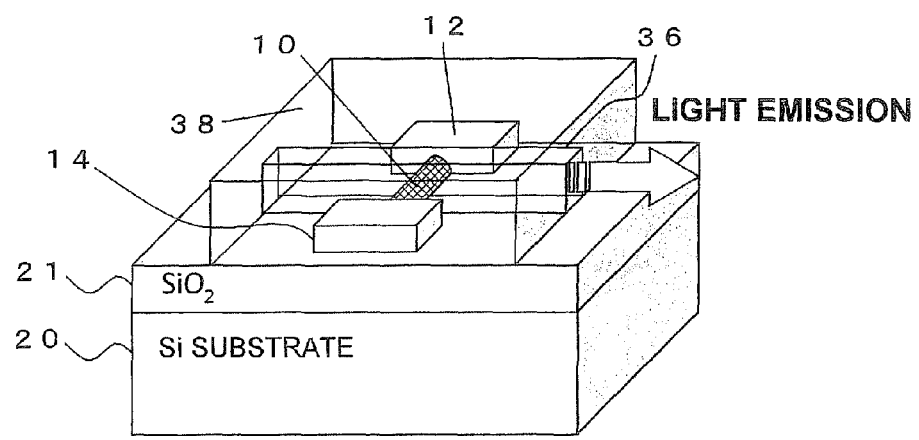
FIG. 8 is a perspective view also showing the configuration of a fourth embodiment.

As shown in FIG. 8, in the present embodiment, a carbon nanotube 10 and electrodes 12, 14 are disposed on an $SiO_2$ film 21 formed on an Si substrate 20, and a core 36 is disposed between the electrodes 12 and 14, so that light is emitted from an end face of the core 36. In the drawing, reference numeral 38 denotes a clad which covers the core 36.

According to the present embodiment, light can be emitted in a direction parallel to the substrate 20.

While a continuum spectrum is attained in blackbody radiation, it is effective to narrow a spectral band width in order to achieve higher speed using silica optical fibers and the like. Accordingly, a description will be given of a light source of a fifth embodiment of the present invention, in which a carbon nanotube light emitting device is interposed between mirrors to fabricate a resonator structure for achieving the light emitting device with a narrow spectral band width which emits light in a direction perpendicular to a substrate.

Figure 9:
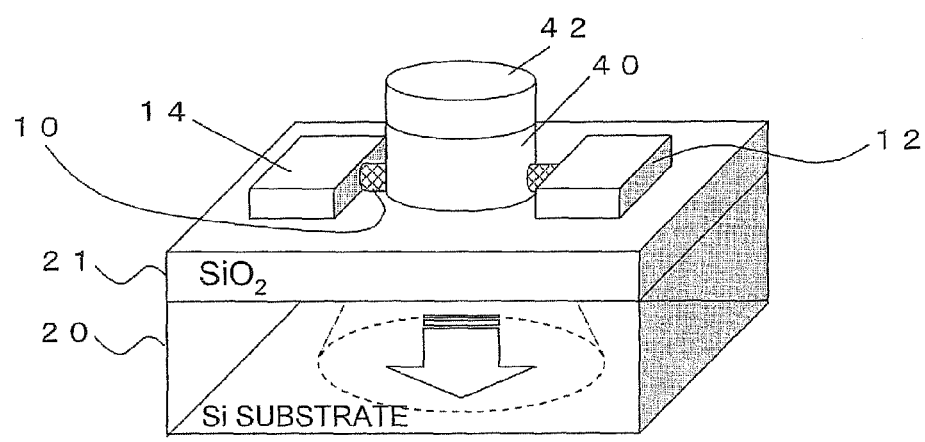
FIGS. 9(A) and 9(B) are a perspective view and a cross sectional view also showing the configuration of a fifth embodiment, respectively.
Figure 9:
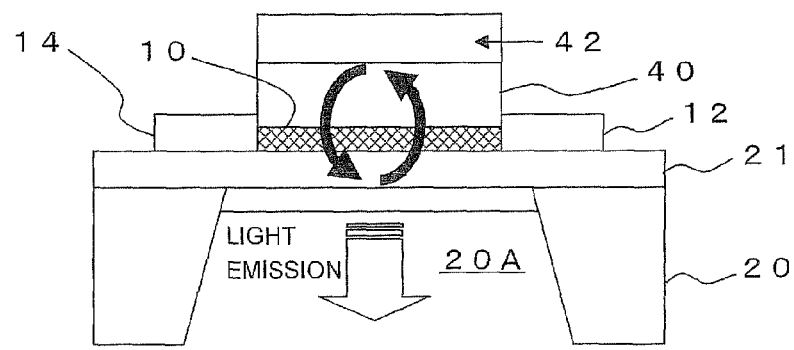

As shown in FIGS. 9(A) (perspective view) and 9(B) (cross sectional view), the present embodiment is configured by using an Si substrate 20 having in its center a hole 20A for allowing light to pass therethrough. A carbon nanotube 10 is covered with a dielectric thin film 40 made of $SiO_2$ and the like, and thin film mirrors 42 made of, for example, gold are disposed on an upper surface of the dielectric thin film 40 and on a lower surface of an $SiO_2$ film 21.

According to the present embodiment, it becomes possible to emit light with a narrow spectral band width.

Figure 10:
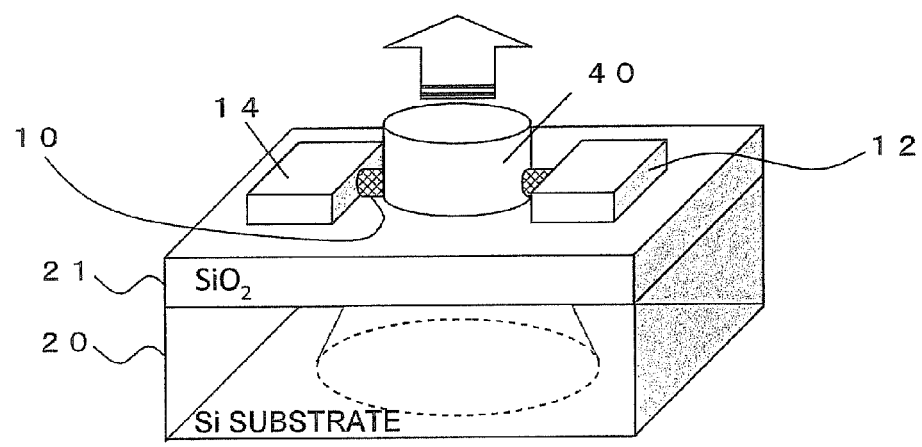
FIGS. 10(A) and 10(B) are a perspective view and a cross sectional view also showing the configuration of a sixth embodiment, respectively.
Figure 10:
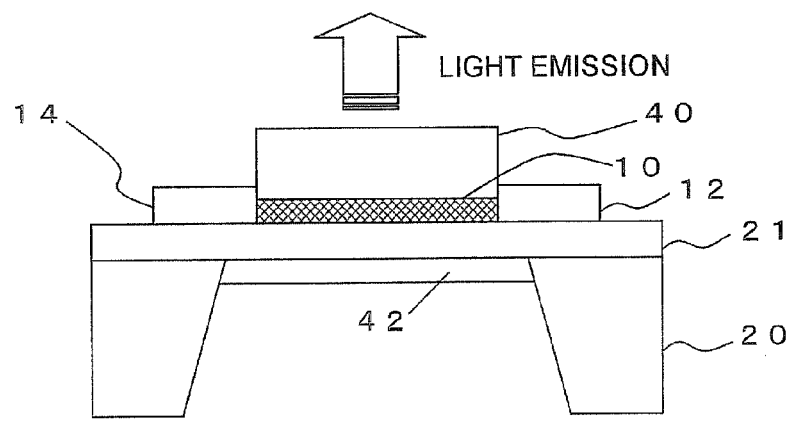

Next, a sixth embodiment of the present invention configured to take out light from its top surface by removing the upper mirror of the fifth embodiment is shown in FIG. 10.

Figure 11:
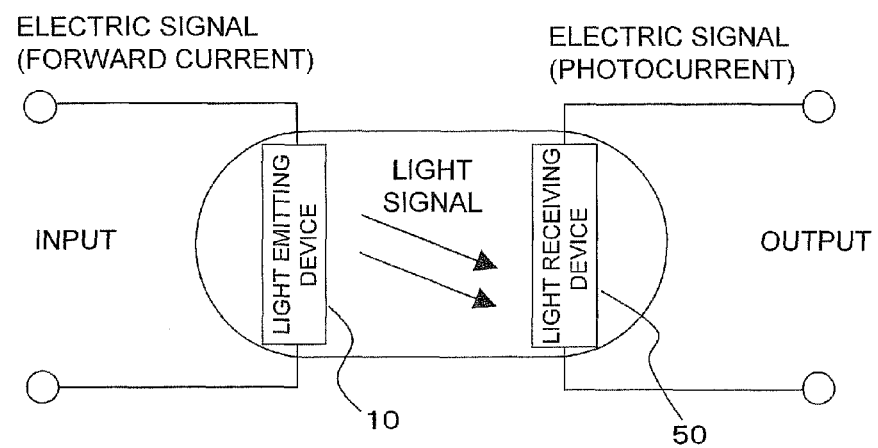
FIGS. 11(A) and 11(B) are a circuit diagram and a cross sectional view showing the configuration of a seventh embodiment of the present invention which is a photo coupler using the light emitting device according to the present invention, respectively.
Figure 11:
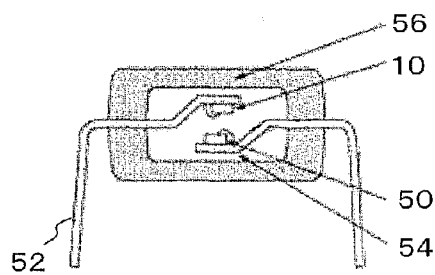

Since the light source modulated at high speed can be obtained at a low cost, the present invention is expected to be applied to photo couplers. As shown in FIG. 11 as one example, a photo coupler is an device which uses a light emitting device 10 and a light receiving device 50 such as a photo transistor chip as a pair to convert an electric signal into light for transmission. In the photo coupler, an input and an output are electrically insulated, so that the photo coupler is used in various apparatuses for the purpose of information transmission between circuits which are different in reference voltage as well as for the purpose of noise removal. Since light emitting diodes are used in the photo couplers which are currently in practical use, the transmission speed of so-called ultra high-speed photo couplers is only about 10 Mbps. However, using the present invention makes it possible to achieve considerably higher speed. Moreover, since the photo coupler of the present invention can be fabricated at a low cost and have a simple configuration, it is considered that the photo coupler may be put in practical use at a relatively early stage.

FIGS. 11(A) and 11(B) respectively show a basic configuration and an internal configuration of a photo coupler which is a seventh embodiment according to the present invention.

In the drawings, there are shown a lead frame 52, a translucent epoxy resin 54 covering a light emitting device 10 and a light receiving device 50, and a black epoxy resin 56 covering the periphery of the translucent epoxy resin 54.

INDUSTRIAL APPLICABILITY

The present invention is expected to be used as a light source for on-chip optical interconnections/light sources for optical circuits on optical integrated circuits (PICs) and optoelectronic integrated circuits (OEICs) and also as light sources for inter-chip/inter-board optical interconnections because of the characteristics of the present invention which are high-speed modulation performance, a minute light source, and capability of being integrated on silicon.

REFERENCE SIGNS LIST

10 . . . metal carbon nanotube (CNT)
12, 14 . . . electrode
20 . . . substrate
21 . . . SiO$_2$ film
22 . . . transparent substrate
32 . . . optical fiber
34, 36 . . . core
38 . . . clad
40 . . . dielectric thin film
42 . . . thin film mirror
50 . . . light receiving device

The invention claimed is:

1. A carbon nanotube light emitting device, comprising:
a plurality of electrodes;
carbon nanotubes disposed between the plurality of electrodes, at least part of the carbon nanotubes including a metal carbon nanotube, and
an insulator covering at least a surface of the metal carbon nanotube, wherein the metal carbon nanotube is configured to generates heat upon passing of current to the plurality of electrodes and is configured to emits light by blackbody radiation, so that the emitted light is configured to be modulated.

2. The carbon nanotube light emitting device according to claim 1, wherein the metal carbon nanotube and the plurality of electrodes are disposed on a substrate.

3. A photo coupler, comprising: the carbon nanotube light emitting device according to claim 2; and a light receiving device.

4. A light source comprising the carbon nanotube light emitting device according to claim 1 wherein the metal carbon nanotube is disposed on a substrate so as to be orthogonal to an optical fiber.

5. A light source comprising the carbon nanotube fight emitting device according to claim 1, wherein the metal carbon nanotube and the plurality of electrodes are disposed on a substrate so that light is configured to be emitted in a direction parallel to a surface of the substrate.

6. A light source comprising the carbon nanotube light emitting device according to claim 1, wherein the metal carbon nanotube and the plurality of electrodes are disposed on a substrate so that light is configured to be emitted in a direction perpendicular to a surface of the substrate.

7. A photo coupler, comprising: the carbon nanotube light emitting device according to claim 1; and a light receiving device.

8. A carbon nanotube light emitting device, comprising:
a plurality of electrodes; and
carbon nanotubes disposed between the plurality of electrodes, at least part of the carbon nanotubes including a metal carbon nanotube, wherein the metal carbon nanotube is held in vacuum and is configured to generates heat upon passing of current to plurality of the electrodes and is configured to emits light by blackbody radiation, so that the emitted light is configured to be modulated.

9. The carbon nanotube light emitting device according to claim 8, wherein the metal carbon nanotube and the plurality of electrodes are disposed on a substrate.

10. A photo coupler, comprising: the carbon nanotube light emitting device according to claim 9; and a light receiving device.

11. A photo coupler, comprising: the carbon nanotube light emitting device according to claim 8; and a light receiving device.

12. A light source, comprising the carbon nanotube light emitting device according to claim 8 wherein the metal carbon nanotube is disposed on a substrate so as to be orthogonal to an optical fiber.

13. A light source, comprising the carbon nanotube light emitting device according to claim 8, wherein the metal carbon nanotube and the plurality of electrodes are disposed on a substrate so that light is configured to be emitted in a direction parallel to a surface of the substrate.

14. A light source, comprising the carbon nanotube light emitting device according to claim 8, wherein the metal carbon nanotube and the plurality of electrodes are disposed on a substrate so that light is configured to be emitted in a direction perpendicular to a surface of the substrate.

* * * * *